United States Patent
Nino et al.

(10) Patent No.: US 11,055,614 B2
(45) Date of Patent: Jul. 6, 2021

(54) MEMRISTIVE NANOFIBER NEURAL NETWORKS

(71) Applicant: University of Florida Research Foundation, Inc., Gainesville, FL (US)

(72) Inventors: Juan Claudio Nino, Gainesville, FL (US); Jack Kendall, Millbrae, CA (US)

(73) Assignee: UNIVERSITY OF FLORIDA RESEARCH FOUNDATION, INC., Gainesville, FL (US)

(*) Notice: Subject to any disclaimer, the term of this patent is extended or adjusted under 35 U.S.C. 154(b) by 0 days.

(21) Appl. No.: 16/786,420

(22) Filed: Feb. 10, 2020

(65) Prior Publication Data

US 2020/0184323 A1 Jun. 11, 2020

Related U.S. Application Data

(63) Continuation of application No. 16/239,996, filed on Jan. 4, 2019, now Pat. No. 10,614,358, which is a
(Continued)

(51) Int. Cl.
*G06N 3/063* (2006.01)
*G06N 3/08* (2006.01)
*G06N 3/04* (2006.01)

(52) U.S. Cl.
CPC .......... *G06N 3/0635* (2013.01); *G06N 3/049* (2013.01); *G06N 3/0445* (2013.01); *G06N 3/08* (2013.01)

(58) Field of Classification Search
CPC ........ G06N 3/049; G06N 3/0635; G06N 3/08; G06N 3/0445; G06N 3/0418;
(Continued)

(56) References Cited

U.S. PATENT DOCUMENTS

| 8,930,291 | B1 | 1/2015 | Srinivasa et al. | |
| 9,418,331 | B2* | 8/2016 | Gupta | G06N 3/08 |

(Continued)

FOREIGN PATENT DOCUMENTS

| JP | H07282168 | 10/1995 |
| JP | H09185596 | 7/1997 |

(Continued)

OTHER PUBLICATIONS

Office Action dated May 4, 2020 for Brazilian Patent Application No. BR112016029582-6.
(Continued)

*Primary Examiner* — Thong Q Le
(74) *Attorney, Agent, or Firm* — Thomas | Horstemeyer, LLP.; Jason M. Perilla

(57) ABSTRACT

Disclosed are various embodiments of memristive devices comprising a number of nodes. Memristive fibers are used to form conductive and memristive paths in the devices. Each memristive fiber may couple one or more nodes to one or more other nodes. In one case, a memristive device includes a first node, a second node, and a memristive fiber. The memristive fiber includes a conductive core and a memristive shell surrounding at least a portion of the conductive core along at least a portion of the memristive fiber. The memristive fiber couples the first node to the second node through a portion of the memristive shell and at least a portion of the conductive core.

19 Claims, 7 Drawing Sheets

Related U.S. Application Data continuation of application No. 15/383,527, filed on Dec. 19, 2016, now Pat. No. 10,198,691, which is a continuation-in-part of application No. PCT/US2015/034414, filed on Jun. 5, 2015.

(60) Provisional application No. 62/014,201, filed on Jun. 19, 2014, provisional application No. 62/330,485, filed on May 2, 2016, provisional application No. 62/338,691, filed on May 19, 2016.

(58) Field of Classification Search
CPC ...... G06N 3/0472; G06N 3/063; G06N 3/088; G06N 3/04; G06N 3/067; G06N 3/0454; G06N 3/084; G06N 3/02; G06N 20/00; G06N 3/082; G06N 3/10; G06N 3/0481; G06N 7/005; G06N 3/0427; G06N 3/105; G06N 20/20; G11C 13/0007; G11C 11/56; G11C 13/00; G06G 7/60
See application file for complete search history.

(56) References Cited

U.S. PATENT DOCUMENTS

| | | | |
|---|---|---|---|
| 9,646,243 | B1 | 5/2017 | Gokmen |
| 10,198,691 | B2 | 2/2019 | Nino et al. |
| 2004/0150010 | A1 | 8/2004 | Snider |
| 2004/0153426 | A1 | 8/2004 | Nugent |
| 2010/0081958 | A1 | 4/2010 | She |
| 2011/0096589 | A1 | 4/2011 | Bratkovski et al. |
| 2012/0011088 | A1 | 1/2012 | Aparin et al. |
| 2012/0011090 | A1 | 1/2012 | Tang et al. |
| 2012/0011093 | A1 | 1/2012 | Aparin et al. |
| 2012/0194967 | A1 | 8/2012 | Keane et al. |
| 2014/0151623 | A1 | 6/2014 | Jeon et al. |
| 2014/0156574 | A1 | 6/2014 | Piekniewski et al. |
| 2014/0156576 | A1 | 6/2014 | Nugent |
| 2015/0019468 | A1* | 1/2015 | Nugent ............... G06N 3/063 706/25 |
| 2015/0106316 | A1 | 4/2015 | Birdwell et al. |
| 2016/0004960 | A1 | 1/2016 | Saïghi et al. |
| 2016/0275395 | A1 | 9/2016 | Amir et al. |
| 2017/0017879 | A1 | 1/2017 | Kataeva et al. |

FOREIGN PATENT DOCUMENTS

| | | |
|---|---|---|
| JP | 2013534676 | 9/2013 |
| KR | 1020170019414 | 2/2017 |
| WO | 2010106116 A1 | 9/2010 |

OTHER PUBLICATIONS

Ben et al., Neurogrid : A Mixed-Analog-Digital Multichip System for Large-Scale Neural Simulations. Proceedings of the IEEE 102.5, 699-716 (May 2014).

Burger et al., Hierarchical composition of memristive networks for real-time computing. Nanoscale Architectures (NANOARCH), 2015 IEEE/ACM International Symposium on. IEEE, (Jul. 2015).

Chan et al., Spike timing dependent plasticity with memristive synapse in neuromorphic systems, The 2012 International Joint Conference on Neural Networks (IJCNN), (Jun. 1-6, 2012).

Deng et al., Deep convex net: A scalable architecture for speech pattern classification. Proceedings of the Annual Conference of the International Speech Communication Association, Interspeech, 2285-2288 (Aug. 2011).

Grishin et al., Nb2O5 nanofiber memristor, Applied Physics Letters, 103(5), 053111 (Jul. 2013).

Hasler et al., Finding a roadmap to achieve large neuromorphic hardware systems, Frontiers in Neuroscience, 7, 118 (Sep. 2013).

Hutchinson et al., Tensor deep stacking networks. IEEE Transactions on Pattern Analysis and Machine Intelligence, 35(8), 1944-1957 (Aug. 2013).

Izhikevich et al., Large-scale model of mammalian thalamocortical systems. Proceedings of the National Academy of Sciences of the United States of America, 105(9), 3593-8 (Mar. 2008).

Jo et al., Nanoscale memristor device as synapse in neuromorphic systems, Nano Letters, 10(4), 1297-1301 (Mar. 2010).

Li et al., Fabrication of Titania Nanofibers by Electrospinning. Nano Letters, 3(4), 555-560 (Apr. 2003).

Merolla et al., A digital neurosynaptic core using embedded crossbar memory with 45pJ per spike in 45nm. Custom Integrated Circuits Conference (CICC), 2011 IEEE. IEEE, (Sep. 2011).

Moghe et al., Co-axial Electrospinning for Nanofiber Structures: Preparation and Applications, Polymer Reviews, Polymer Reviews 48.2,353-377 (May 2008).

Naderi, M. A., Analysis and classification of EEG signals using spectral analysis and recurrent neural networks, Biomedical Engineering (ICBME), 2010 17th Iranian Conference of. IEEE, (Nov. 2010).

Strukov et al., The missing memristor found, Nature, 453(7191), 80-3, (May 2008).

Waser et al., Redox-Based Resistive Switching Memories—Nanoionic Mechanisms, Prospects, and Challenges, Advanced Materials, 21(25-26), 2632-2663 (Jul. 2009).

Williams, R. S. (n. d.), How We Found the Missing Memristor, Spectrum, IEEE, 45(12), 28-35 (Dec. 2008).

Zhi et al., Highly conductive electrospun carbon nanofiber/MnO2 coaxial nano-cables for high energy and power density supercapacitors, Journal of Power Sources, 208, 345-353 (Jun. 2012).

Zidan et al., Single-Readout High-Density Memristor Crossbar, Scientific reports 6, (Jan. 2-10, 2016).

International Search Report for application No. EP 15810294; dated Jan. 18, 2018; The Hague; 10 pages.

Manan Suri et al.; "Bio-Inspired Stochastic Computing Using Binary CBRAM Synapses"; IEEE Transactions on Electron Devices; vol. 60. No. 7; Jun. 4, 2013; pp. 2402-2409.

A. Carnell, "An analysis of the use of Hebbian and Anti-Hebbian spike time dependent plasticity learning functions within the context of recurrent spiking neural networks," Neurocomputing, vol. 72, No. 4-6, pp. 685-692, Jan. 2009.

A. E. J. Senador, M. T. Shaw, and P. T. Mather, "Electrospinning of Polymeric Nanofibers: Analysis of Jet Formation," Mat. Res. Soc. Symp. Proc., 2001, vol. 661.

A. Joubert, B. Belhadj, O. Temam, and M. Campus, "Hardware spiking neurons design?: analog or digital??" (2012).

Astaras, A. "Pulse-Stream Binary Stochastic Hardware for Neural Computation: The Helmoltz Machine." A Thesis Submitted for The Degree of Doctor of Philosophy,The University of Edinburgh. (pp. 1-40, 150-176), Sep. 13, 2004. [online] [retrieved on Dec. 27, 2017 (Dec. 27, 2017)] Retrieved from the Internet: URL: https://www.era.lib.ed.ac.uk/handle/1842/11620, entire document, especially Abstract; Figure 4, 5; pp. 23-33, 154-155, 172.

Buzsaki, G. (2006). Rhythms of the Brain. Oxford University Press.

C. Zamarreño-Ramos, L. A. Camuñas-Mesa, J. A. Pérez-Carrasco, T. Masquelier, T. Serrano-Gotarredona, and B. Linares-Barranco, "On spike-timing-dependent-plasticity, memristive devices, and building a self-learning visual cortex.," Front. Neurosci., vol. 5, No. March, p. 26, Jan. 2011.

Chronakis, I. S. (2005). Novel nanocomposites and nanoceramics based on polymer nanofibers using electrospinning process—A review. Journal of Materials Processing Technology, 167(2-3), 283-293. doi:10.1016/j.matprotec.2005.06.053.

J. Matser, "Structured Liquids in Liquid State Machines," Utrecht University, 2010.

J. Sundaramurthy, V. Aravindan, P. S. Kumar, S. Madhavi, and S. Ramakrishna, "Electrospun TiO 2-d Nanofibers as Insertion Anode for Li-Ion Battery Applications," J. Phys. Chem. C, 2014.

Japanese Patent Application JP2016-573557 filed on Jun. 5, 2015, Office Action dated Sep. 11, 2018.

K. Szot, M. Rogala, W. Speier, Z. Klusek, a Besmehn, and R. Waser, "TiO2—a prototypical memristive material.," Manotechnology, vol. 22, No. 25, p. 254001, Jun. 2011.

Kee et al. "Feed-Forward versus Feedback Inhibition in a Basic Olfactory Circuit" In: PLoS Comput Biol 11(10):, Oct. 15, 2015 [online] [retrieved on Dec. 27, 2017 (Dec. 27, 2017)] Retrieved

(56) References Cited

OTHER PUBLICATIONS from the Internet: URL: http://journals.plos.org/ploscompbiol/article?id=10.1371/journal.pcbi.1004531, entire document.

Nicole Casal Moore, College of Engineering,image processing 1,000 times faster is goal of new $5M contact, U-M Press Release, USA, University of Michigan, Aug. 14, 2013. URL, http://www.eecs.umich.edu/eecs/about/articles/2013/Lu-image-processing-1000-times-faster.html.

Pantazi et al. "All-Memristive Neuromorphic Computing With Level-Tuned Neurons" In: Nanotechnology 27 (2016), Jul. 26, 2016.[online] [retrieved on Dec. 27, 2017 (Dec. 27, 2017)] Retrieved from the Internet: URL: http://topscience.iop.org/article/10.1088/0957-4484/27/35/355205/meta, entire document.

PCT Patent Application PCT/US2017/058757 filed on Oct. 27, 2017, International Search Report and Written Opinion dated Jan. 18, 2018.

PCT Patent Application PCT/US2017/058816 filed on Oct. 27, 2017, International Search Report and Written Opinion dated Jan. 26, 2018.

PCT Patent Application PCT/US2018/033669 filed on May 21, 2018, International Search Report and Written Opinion dated Aug. 6, 2018.

Tran, T. "Simulations of Artificial Neural Network With Memristive Devices"; Boise State University; Publication [online]. Dec. 2012 [retrieved Jul. 14, 2018].

W. Maass, T. Natschlager, and H. Markram, "Real-time computing without stable states: a new framework for neural computation based on perturbations.," Neural Comput., vol. 14, No. 11, pp. 2531-60, Nov. 2002.

Yang, J. J., Pickett, M. D., Li, X., Ohlberg, D. A., Stewart, D. R., & Williams, R. S. (2008). Memristive switching mechanism for metal/oxide/metal nanodevices. Nature Nanotechnology, 3(7), 429-433. doi:10.1038/nnano.2008.160.

Z. Biolek, D. Biolek and V. Biolková, "SPICE Model of Memristor with Nonlinear Dopant Drift," Radioengineering, vol. 18 (2) pp. 210-214.

Japanese Patent Application No. JP2016-573557 filed on Jun. 5, 2015, Office Action dated May 17, 2019.

European Patent Application No. 15810294.7 filed on Jun. 5, 2015, Office Action dated Apr. 5, 2019.

International Search Report for PCT/US15/34414 dated Sep. 11, 2015.

Extended European Search Report for European Application No. 15810294.7 dated Jan. 26, 2018.

Manan Suri et al: "Bio-Inspired Stochastic Computing Using Binary CBRAM Synapses", IEEE Transactions on Electron Devices, vol. 60, No. 7, Jun. 4, 2013 (Jun. 4, 2013), pp. 2402-2409, XP055440870, us ISSN: 0018-9383, DOI: 10.1109/TED.2013.2263000.

Ross D. Pantone, Jack D Kendall, Juan C. Nino; (Jul. 17, 2018) "Memristive nanowires exhibit small-world connectivity," www.elzevier.com/locate/neunet, vol. 106, (pp. 144-151).

Bellew, AT et al. Programmability of nanowire networks. Nanoscale, vol. 6, No. 16, Jun. 19, 2014, pp. 9632-9639 [online], [retrieved on Aug. 22, 2015]. Retrieved from the Internet <URL: http://www.researchgate.net/profile/Allen_Bellew/publication/263745841_Programmability_of_n anowire_networks/links/547882670cf205d1687f4bce.pdf> DOI: 10.1039/c4nr02338b>.

Amit Prakash, Siddheswar Maikap, Sheikh Ziaur Rahaman, Sandip Majumdar, Santanu Manna, Samit K Ray; (2013) "Resistive switching memory characteristics of Ge/GeOx nanowires and evidence of oxygen ion migration," Nanoscale Research Letters, vol. 8 (pp. 1-10).

\* cited by examiner

MEMRISTIVE NANOFIBER NEURAL NETWORKS

CROSS-REFERENCE TO RELATED APPLICATIONS

This application is a continuation of U.S. patent application Ser. No. 16/239,996, entitled "Memristive Nanofiber Neural Networks," filed Jan. 4, 2019, which is a continuation of U.S. patent application Ser. No. 15/383,527, filed Dec. 19, 2016, entitled "Memristive Nanofiber Neural Networks," which is a continuation-in-part of International Application No. PCT/US2015/034414, filed on Jun. 5, 2015, titled "Memristive Nanofiber Neural Networks," which claims priority to U.S. Provisional Application No. 62/014,201, filed on Jun. 19, 2014, titled "Memristive Neural Networks," the entire contents of all of which applications are hereby incorporated herein by reference. U.S. patent application Ser. No. 15/383,527 also claims priority to U.S. Provisional Application No. 62/330,485, filed on May 2, 2016, titled "Memristive Nanofiber for Artificial Neural Networks," and U.S. Provisional Application No. 62/338,691, filed on May 19, 2016, titled "Memristive Nanofiber for Artificial Neural Networks," the entire contents of both of which applications are hereby incorporated herein by reference.

BACKGROUND

A memristor is a two-terminal device that changes its resistance in response to the amount of electrical current that has previously flown through the device. Memristors may be used in crossbar neural network architectures. In a crossbar neural network, multiple memristors are connected in a perpendicular crossbar array with memristor synapses at each crossing. However, crossbar neural network architectures may require the use of complex designs in order to counteract parasitic leak paths. Additionally, redundant synapses do not exist in crossbar neural networks. Furthermore, a recurrent connection in a crossbar neural network requires complex circuit layouts, and from a footprint point of view, crossbar designs scale quadratically in size with the number of neurons.

DETAILED DESCRIPTION

Figure 1:
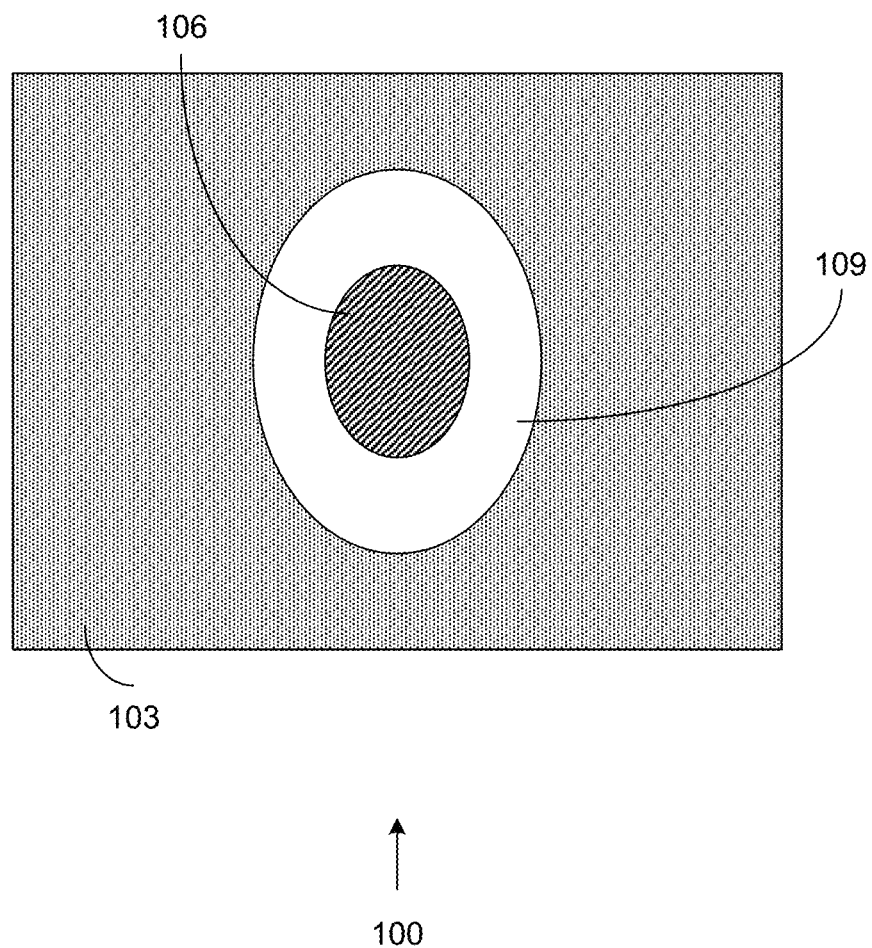
FIG. 1 is a drawing of a core-shell memristive nanofiber according to various embodiments of the present disclosure.

The present disclosure is directed towards neural networks that use memristive fibers. Generally, a neural network may comprise populations of simulated neurons with weighted connections between them. A neural network in accordance with various embodiments of the present disclosure may comprise an array of neural nodes that are interconnected using randomized connections of memristive fibers. Such a neural node may comprise, for example, a Complimentary Metal-Oxide-Semiconductor (CMOS) Leaky Integrate-and-Fire (LIF) neural circuit, or any other suitable type of neural circuit. Each neural node may output one or more signals that are responsive to one or more input signals that the neural node has received. For example, upon one or more input current signals reaching a threshold value, a neural node may output a voltage spike to one or more output paths.

The field of neuromorphic engineering aims to create dedicated hardware for artificial neural networks allowing them to run in real-time and free of the serial processing constraints of conventional computers. This field has been transformed by the invention of the memristor, which can enable nanoscale modifiable synapses; however, challenges still remain. For example, one challenge is the large amount of space required for the wiring between neurons, which takes up significantly more area than the neurons or connections themselves. To overcome this limitation, the present disclosure describes the advantage of using core-shell memristive fibers to create intrinsically memristive wiring between neurons, improving connection efficiency and scalability. Computer simulations have modeled the scalability, connectivity, and feasibility of using memristive nanofibers to replace the wiring and synapses of conventional neuromorphic hardware.

Compared to biological brains, current artificial neural systems are highly inefficient in terms of power consumption, connectivity, and neural density. Some practical neural networks designed for real-world applications such as computer vision, speech recognition, and data classification are embodied in software programs run on conventional digital CPUs and graphics processors. Some digital simulations using these devices are capable of simulating millions of neurons, consume a significant amount of energy, and typically take hours or days to simulate just a few seconds of brain activity. The human brain, on the other hand, is able to process 100 billion neurons, in real time, all while consuming a total of 25 watts. This staggering difference in scale and efficiency between digital implementations and biological neural networks is an inspiration for neuromorphic engineering.

Rather than being bound by the serial processing constraints of conventional digital logic, neuromorphic engineering can create dedicated hardware for artificial neural networks. The neurons in these systems can run independently of one another and in real time using analog physical principles rather than digital logic for computation. These design approaches more closely parallel the guiding principles behind the structure and function of biological neural networks.

As noted above, one device in the field of neuromorphic engineering is the memristor. The memristor can be a two-terminal nanoscale device which is able to modify its resistance simply by passing current in one direction or another through the device. This property makes it well suited for efficiently modeling the synapses between neurons. The memristor can be used for neuromorphic hardware designs. Prior to the memristor, the synapse was perhaps the most complicated component of neuromorphic hardware, with each requiring many transistors to implement. This was a severe limitation, as the number of synapses in a typical neural network vastly exceed the number of neurons. With the memristor, a synapse can be modeled using a device smaller than a single transistor.

One architecture for memristive synapses is the crossbar array. In the crossbar array, each memristor is located at the junction between a horizontal bottom electrode and a vertical top electrode. Each horizontal electrode can be thought of as the output from a single neuron, and each vertical electrode as the input to another neuron to which it is connected. The memristive junction acts as a synapse which can be strengthened or weakened depending on the amount and direction of current flowing through the synapse.

Despite this, the memristor crossbar array has proven difficult to implement in neuromorphic hardware. This is primarily because of its poor scaling properties. As the number of neurons in the array grows, the contribution of the input current into a neuron from parasitic leak pathways becomes increasingly problematic. Modified architectures have been devised in an attempt to combat these leak pathways; although this typically results in increased complexity and lower density of connections. In addition, the scaling properties become even more severe when attempting to model recurrent neural networks, i.e., networks in which the connections form directed cycles.

Further, in the crossbar array, the neurons are fully connected. In other words, each neuron is connected to every one of its neighbors. However, when observing biological neural networks, one finds that connections between neurons tend to be sparse, with any one neuron only connecting to a small fraction of its neighbors. It is believed that such sparse connectivity can allow for more efficient scaling of the network, while minimally impacting the computational capacity for large networks. In that context, the present disclosure describes a sparse, scalable network of memristive nanodevices that can overcome some of the limitations of the crossbar array.

As mentioned above, a neural network may also comprise memristive nanofibers. Memristive nanofibers may be used to form artificial synapses in neural networks. Each memristive nanofiber may couple one or more neural nodes to one or more other neural nodes. In this way, one or more output signals may be transmitted from a particular neural node to one or more other neural nodes. The particular neural nodes to which particular memristive nanofibers are connected may be randomized. In this regard, the particular neural nodes to which the memristive nanofibers are connected are not predetermined prior to the memristive fibers being connected to the one or more neural nodes. As a result of the connections being randomized, the network obtained may exhibit sparse, random connectivity, which has been shown to increase the performance and efficiency of neural networks. Thus, the neural network may be used, for example, to model a Liquid State Machine (LSM). Further description regarding LSMs is provided in Wolfgang Maass et al., Real-Time Computing without Stable States: A New Framework for Neural Computation Based on Perturbations, Neural Computation (Volume 14, Issue 11) (Nov. 11, 2002), which is incorporated by reference herein in its entirety.

Each memristive nanofiber of the memristive neural network may comprise a conductive core, a memristive shell, and one or more electrodes. Memristive nanofibers having a conductive core, memristive shell, and one or more electrodes may be formed using electrospinning or any other suitable method. An electrode of the memristive nanofiber may serve as a conductive attachment point between the memristive nanofiber and an input or output terminal of a neural node. The conductive core of the memristive nanofiber in some embodiments may comprise $TiO_{2-x}$ and/or any other suitable material. The memristive shell may at least partially surround the conductive core and thereby form a synapse between two or more neural nodes. In this regard, the memristive shell may cause the memristive nanofiber to form a connection that increases or decreases in strength in response to the past signals that have traveled through the memristive nanofiber. The memristive shell may comprise $TiO_2$ and/or any other suitable material with memristive properties.

As previously mentioned, in some embodiments, the memristive nanofibers in the memristive neural network may form randomized connections between the neural nodes. Thus, the probability of two neurons being connected decreases as the distance between neural nodes increases. Additionally, patterned electric fields may be used so that particular connection types are more likely to be formed between neural nodes when the connections are made. Additionally, a neural network may be formed using patterned electric fields or other suitable methods so that multiple layers of memristive nanofibers are created. Such a neural network may also comprise connections that facilitate transmission of signals between various layers. In one particular embodiment, the layers and communication paths between layers are modeled after a brain neocortex.

Memristive neural networks in accordance with various embodiments of the present disclosure may provide various types of benefits. For example, such a memristive neural network may be capable of spike-timing-dependent plasticity (STDP). Additionally, the memristive neural network may comprise random, spatially dependent connections. Furthermore, the memristive neural network may comprise inhibitory outputs and/or recurrent connections. As such, the memristive neural networks in accordance with various embodiments of the present disclosure may have properties that are similar to biological neural networks.

With reference to FIG. 1, shown is an example of a core-shell memristive nanofiber 100 according to various embodiments of the present disclosure. Each memristive nanofiber 100 of a memristive neural network may comprise one or more electrodes 103, a conductive core 106, and a memristive shell 109. An electrode 103 of the memristive nanofiber 100 may serve as a conductive attachment point between the memristive nanofiber 100 and an input or output terminal of a neural node. The conductive core 106 of the memristive nanofiber 100 in some embodiments may comprise $TiO_{2-x}$ and/or any other suitable material with memristive properties. The memristive shell 109 may at least partially surround the conductive core 106 and thereby form a synapse between two or more neural nodes. In this regard, the memristive shell 109 may cause the memristive nanofiber 100 to form a connection that increases or decreases in strength in response to the past signals that have traveled through the memristive nanofiber 100. The memristive shell 109 may comprise $TiO_2$ and/or any other suitable material, such as polyaniline, among others.

Figure 2:
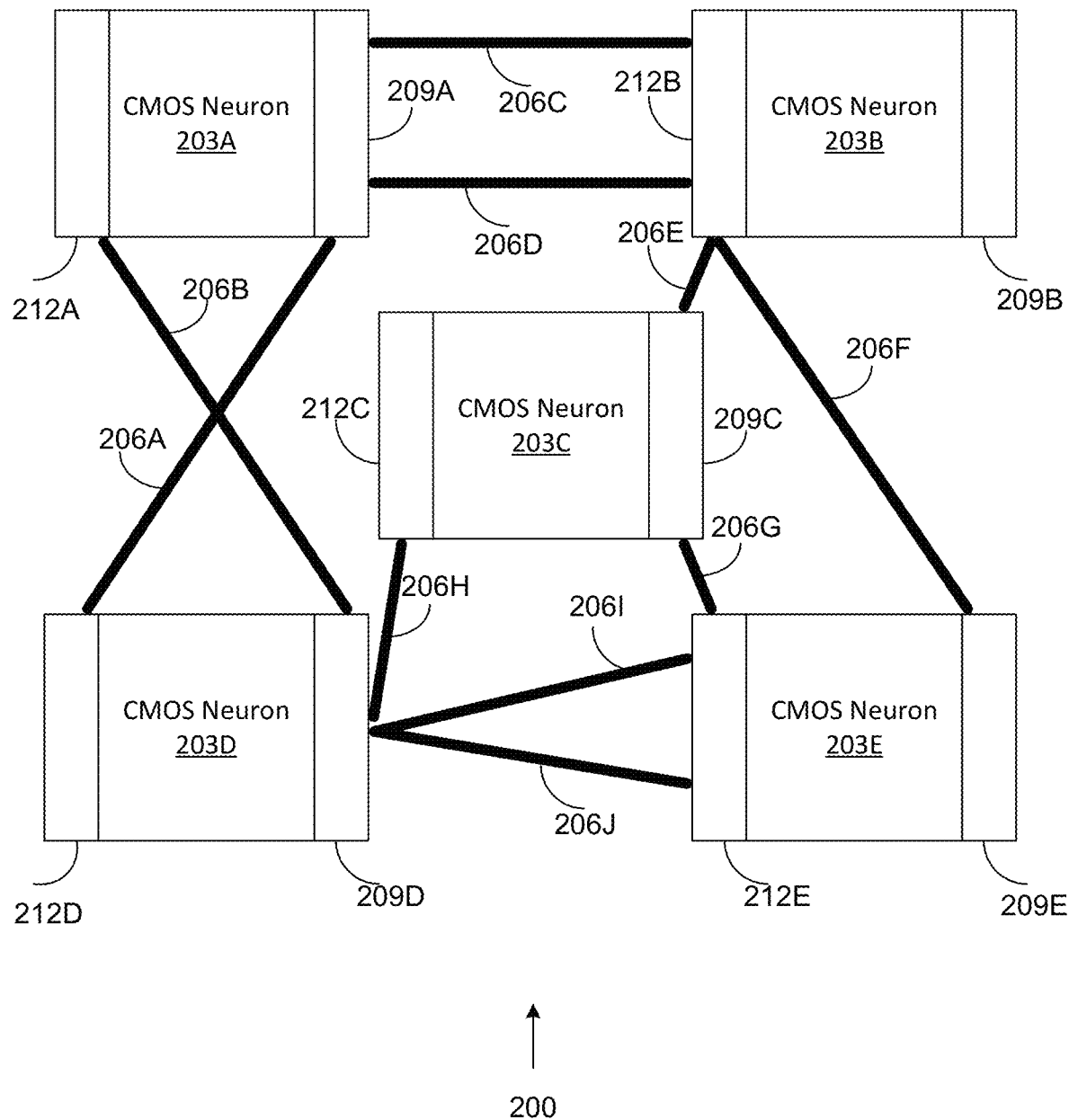
FIG. 2 is a drawing of an example of a nanofiber-based memristive neural network according to various embodiments of the present disclosure.

With reference to FIG. 2, shown is an example of a nanofiber-based memristive neural network 200 according to various embodiments of the present disclosure. The memristive nanofibers 100 (FIG. 1) can be used as memristive connections 206A-206J between CMOS-based neuron arrays 203A-203E in the nanofiber-based memristive neural network 200. The memristive nanofibers 100 may form randomized memristive connections 206A-206J between inputs 212A-212E and outputs 209A-209E of the CMOS-based neuron arrays 203A-203E.

Figure 3:
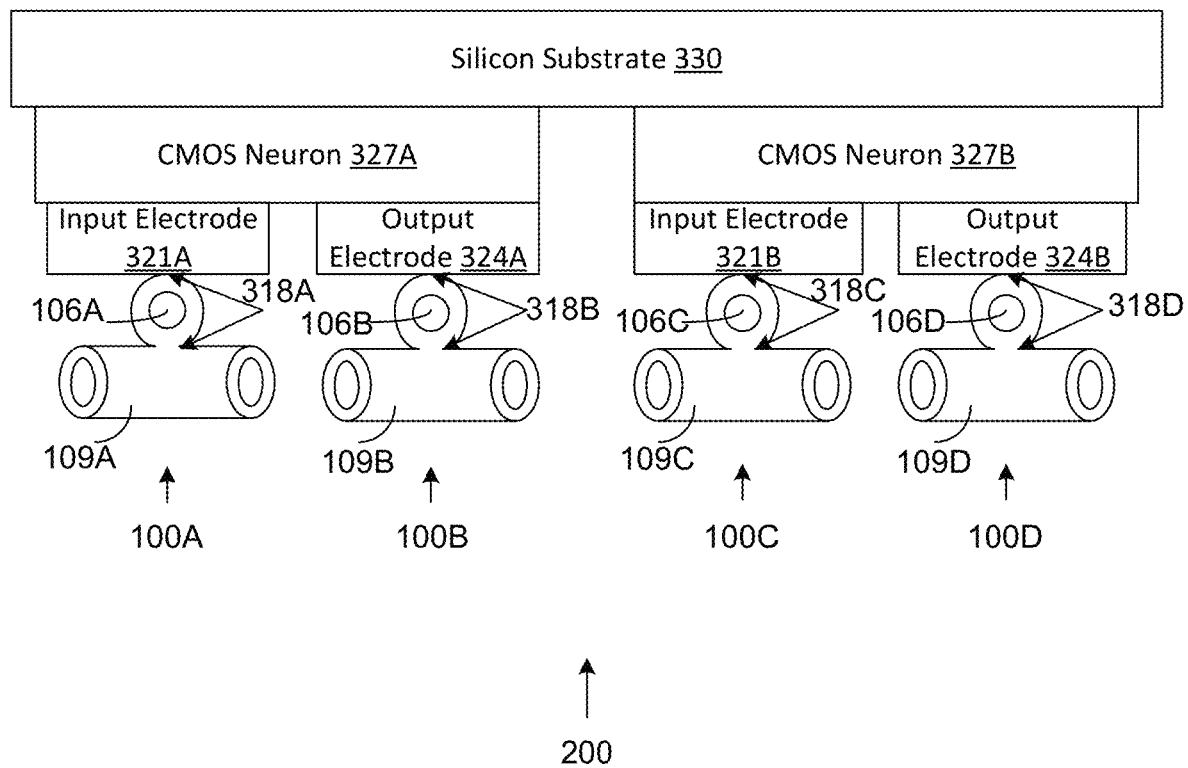
FIG. 3 is a drawing of an example of a nanofiber-based memristive neural network according to various embodiments of the present disclosure.

With reference to FIG. 3, shown is a drawing of an example of a nanofiber-based memristive neural network 200 according to various embodiments of the present disclosure. The nanofiber-based memristive neural network 200 depicts examples of memristive nanofibers 100, referred to herein as memristive nanofibers 100A-100D, comprising conductive cores 106, referred to herein as the conductive cores 106A-106D, and memristive shells 109, referred to herein as the memristive shells 109A-109D. The memristive nanofibers 100A-100D may be used as memristive connections 206A-206J between CMOS neurons 327A and 327B located on the silicon substrate 330. Each memristive shell 109A-109D partially surrounds each conductive core 106A-106D and thereby forms a synapse 318A-318D between two or more neural nodes. The input electrodes 321A and 321B and output electrodes 324A and 324B may serve as conductive attachment points between memristive nanofibers 100A-100D and input terminals 212A-212E or output terminals 209A-209E of the neural nodes.

Figure 4:
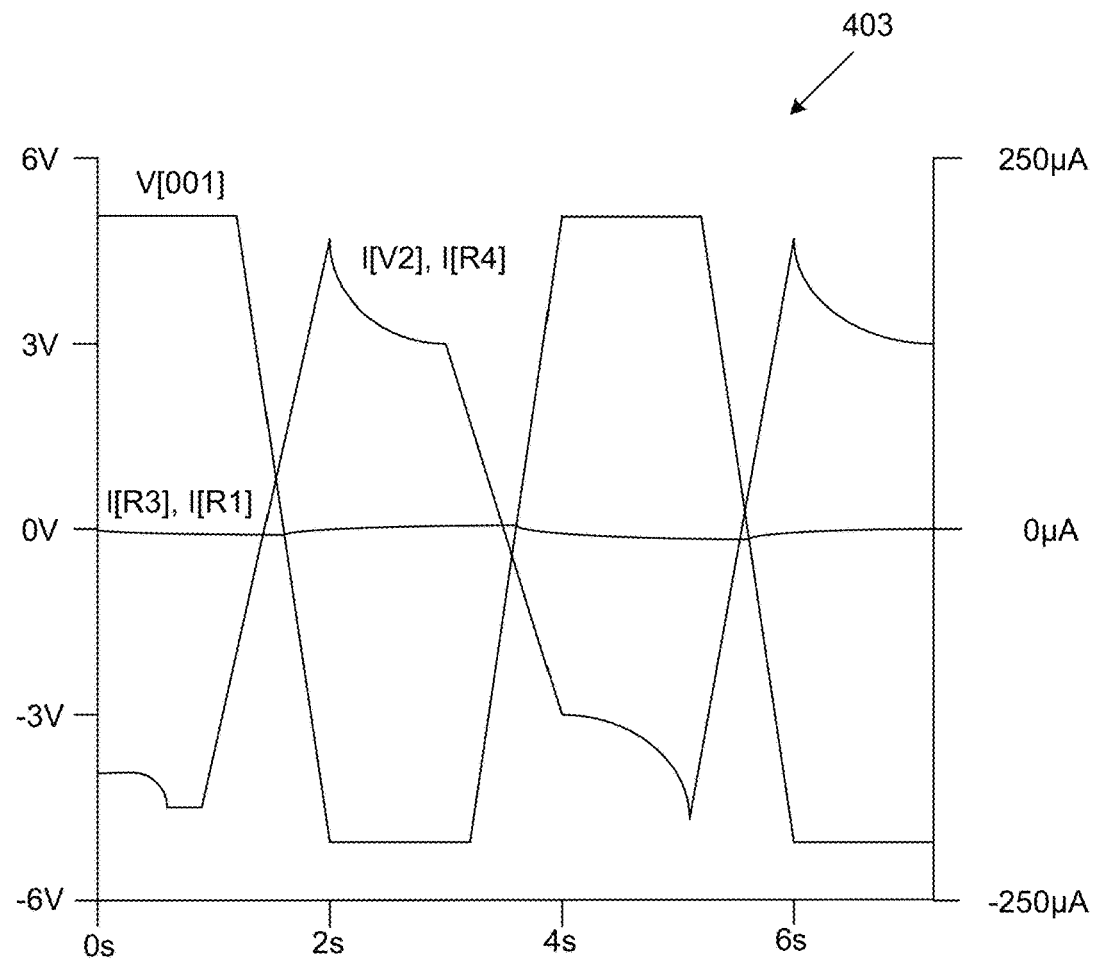
FIG. 4 is a drawing of an example of a simulation of a circuit layout of a nanofiber-based memristive neural network according to various embodiments of the present disclosure.
Figure 4:
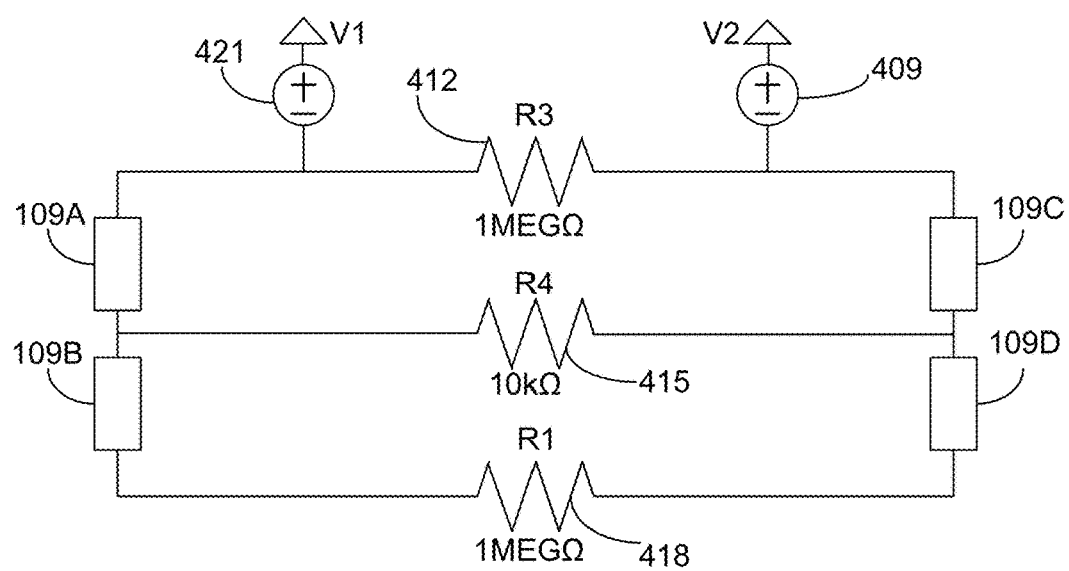

With reference to FIG. 4, shown is a simulation 403 of an example of a circuit 406 of a nanofiber-based memristive neural connection according to various embodiments of the present disclosure. The circuit 406 depicts a nanofiber-based memristive neural connection including memristive shells 109A-109D, voltage source V1 421, voltage source V2 409, resistor R3 412, resistor R4 415, and resistor R1 418. The simulation 403 shows that driving current through a nanofiber-based memristive neural connection will not cause the effects from opposing memristors on a nanofiber to cancel each other out.

Figure 5:
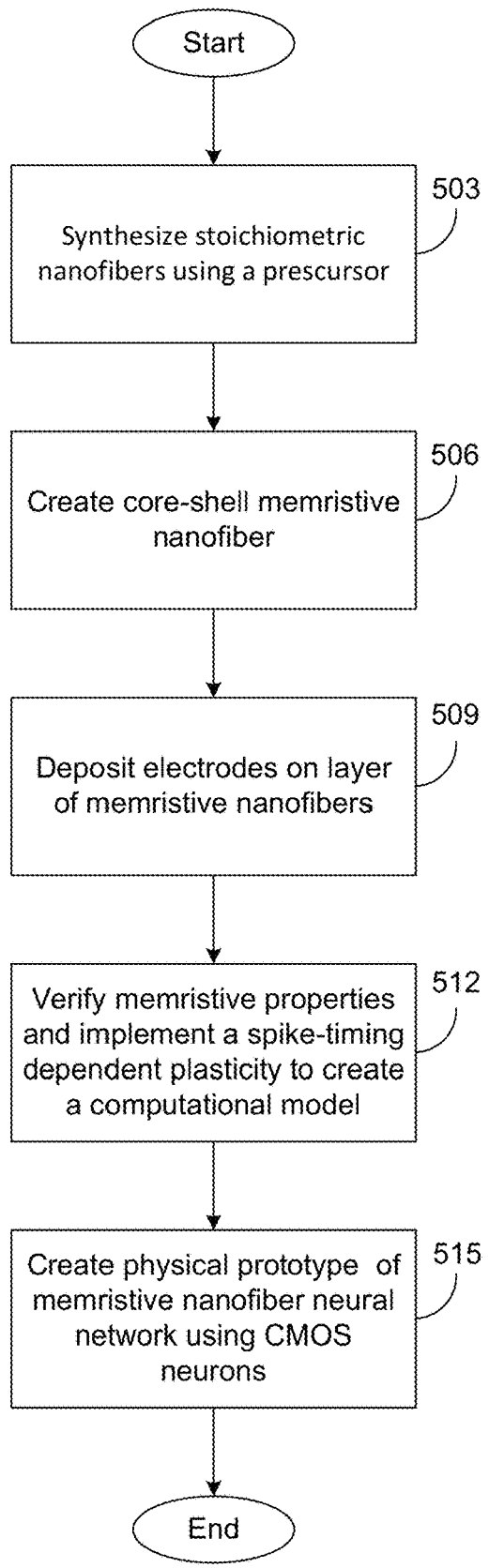
FIG. 5 is a flowchart illustrating an example of a method of creating a nanofiber-based memristive neural network according to various embodiments of the present disclosure.

With reference to FIG. 5, shown is a flowchart illustrating one example of a method of creating a nanofiber-based memristive neural network 200 (FIG. 2) according to various embodiments of the present disclosure. Beginning with box 503, stoichiometric nanofibers are synthesized using a precursor. The stoichiometric nanofibers may comprise, for example, $TiO_2$ and/or any other suitable material. The precursor may be for example, titanium isopropoxide, titanium butoxide, or another suitable precursor.

Next, in box 506, a core-shell memristive nanofiber 100 (FIG. 1) is created. The core-shell memristive nanofiber 100 (FIG. 1) may be created by electrospinning a stoichiometric $TiO_2$ outer shell 109 with a doped conductive $TiO_{2-x}$ core 106. Then, in box 509, electrodes 103 may be deposited on the core-shell memristive nanofiber 100 (FIG. 1).

Next, in box 512, memristive properties are verified and a spike-timing dependent plasticity is implemented to create a computational model based on the nanofiber network response. Then, in box 515, a physical prototype of a memristive nanofiber neural network 200 using CMOS neurons 327A-327B is created. Thereafter, the process ends.

Figure 6:
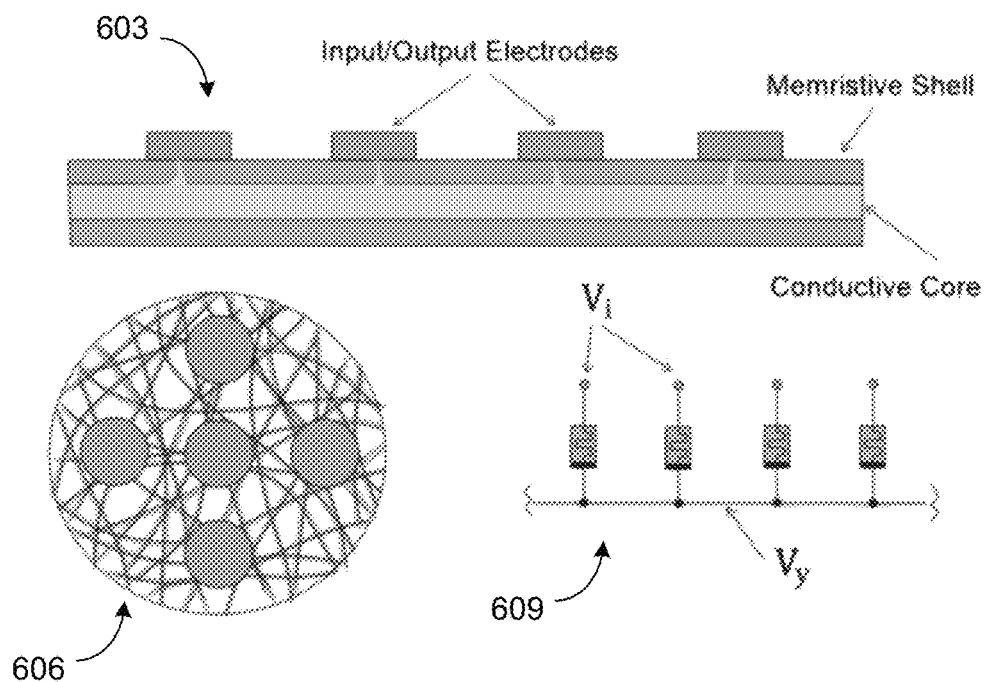
FIG. 6 is a drawing illustrating an example of a nanofiber-based memristive neural network according to various embodiments of the present disclosure.

Turning to FIG. 6, shown is a drawing representing an example of a nanofiber-based memristive neural network according to various embodiments of the present disclosure. FIG. 6 includes a memristive fiber cross-section 603. The memristive shell forms modifiable, conducting filaments between the core of the fiber and each electrode. FIG. 6 also includes a top-down view 606 of the memristive neural network, showing memristive fibers and electrodes. FIG. 6 also shows a circuit schematic 609 of the memristive neural network, where Vi are the electrode voltages and Vy is the voltage on the core.

FIG. 6 illustrates a randomly aligned network of nanofibers with a conductive core and a memristive shell. Electrodes are deposited onto the network of nanofibers, and these electrodes are then interfaced with the inputs and outputs of an array of silicon neurons. The nanofibers therefore serve as the connections between the artificial neurons. The conductive core allows signals to be transmitted between the neurons, while the memristive shell creates modifiable connections between the neurons and the core of the fiber. These connections can serve as the synapses of the network and can be strengthened or weakened by controlling the amount and direction of current passing through the memristors.

One advantage of this network architecture is that it allows for the wiring and connections to be completely offloaded from the silicon chip housing the artificial neurons. This can greatly increase the density of neurons on a single chip, given that the majority of the space in conventional neuromorphic hardware is taken up by the wiring and connections. Since the nanofiber network can be interfaced with the silicon neurons simply by sandwiching the two chips together, contacting their bare electrodes, the area of a single chip would need not be more than the area required for the neurons alone.

Electrospinning is one technique capable of producing nanofibers from a wide range of materials. Many studies have demonstrated the synthesis of conductive nanofibers via electrospinning, and there are multiple techniques for achieving core-shell composite nanofibers. For instance, the nanofibers can be coaxially electrospun to produce core-shell fibers in a single-step process. There are also many methods for the two-step production of core-shell nanofibers, such as electrospinning of the core and subsequent chemical vapor deposition of the shell. Likewise, many materials which have demonstrated memristive behavior such as $Nb_2O_5$ and $TiO_2$ are routinely electrospun into nanofibers.

In order to determine the connectivity and scaling properties of the network, an electrospun mat of $TiO_2$ nanofibers can be synthesized, and SEM images of the nanofibers were taken. Hypothetical electrodes of diameter 10 μm can be overlaid on the SEM images, and the average number of fibers connecting any two electrodes can be counted as a function of distance between the electrodes, as shown in FIG. 3. The average number of fibers connecting two electrodes can be fit by an inverse power law as a function of distance.

Extrapolating this scaling law to larger networks, the maximum number of neurons and synapses that could be reasonably be fit on a single chip using 120 μm2 analog integrate and fire neurons can be calculated. These numbers can be compared to two benchmark neuromorphic hardware devices: IBM's SyNAPSE chip and Stanford's Neurocore processor. Such a comparison can be made using identical chip areas, for example, as given below in Table 1.

TABLE 1

Benchmark Neuromorphic Comparison

| Architecture | Total Neurons | Total Synapses | Chip Area |
|---|---|---|---|
| IBM SyNAPSE | 256 | 250,000 | 4.2 mm² |

TABLE 1-continued

Benchmark Neuromorphic Comparison

| Architecture | Total Neurons | Total Synapses | Chip Area |
|---|---|---|---|
| Proposed Architecture | 14,500 | 3,500,000 | 4.2 mm² |
| Stanford Neurocore | 65,500 | 6,000,000 | 165 mm² |
| Proposed Architecture | 570,000 | 1,600,000,000 | 165 mm² |

In order to assess the computational properties of the network, a simulation was run following the connectivity and scaling parameters described above. In one simulation, a total of 512 integrate and fire neurons can be arranged on a square array and connected according to a probability distribution derived from the connectivity scaling law described above. Approximately 20% of these neurons can be designated as inhibitory, and the rest can be excitatory.

Figure 7:
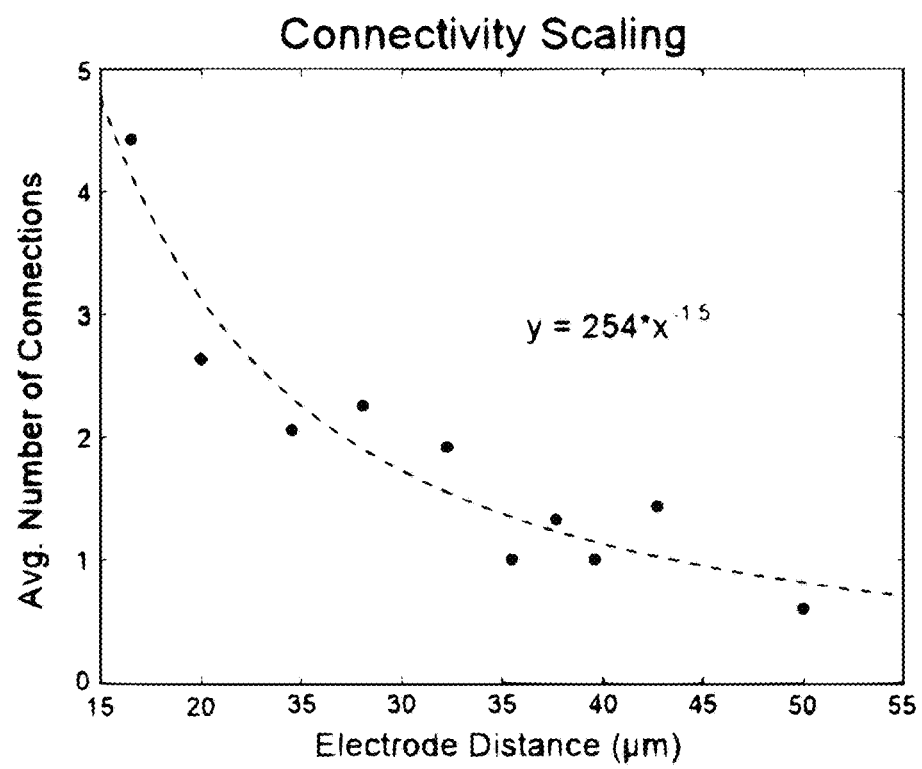
FIG. 7 is a graph showing an example of connectivity scaling of a nanofiber-based memristive neural network according to various embodiments of the present disclosure.

FIG. 7 is a graph showing results of connectivity scaling as described above. The average number of connections between hypothetical electrodes on a nanofiber mat can be plotted as a function of distance between the electrodes as shown. Note that the connections between neurons can be assumed to be static in this simulation. This may not be the case in some proposed architectures with memristive synapses, however modeling the memristive plasticity can greatly increase simulation times. The simulated network shows similarities to biological neural activity, and suggests that the network may have useful computational properties. A power spectral density analysis of the activity in the network can be performed to test this hypothesis.

Figure 8:
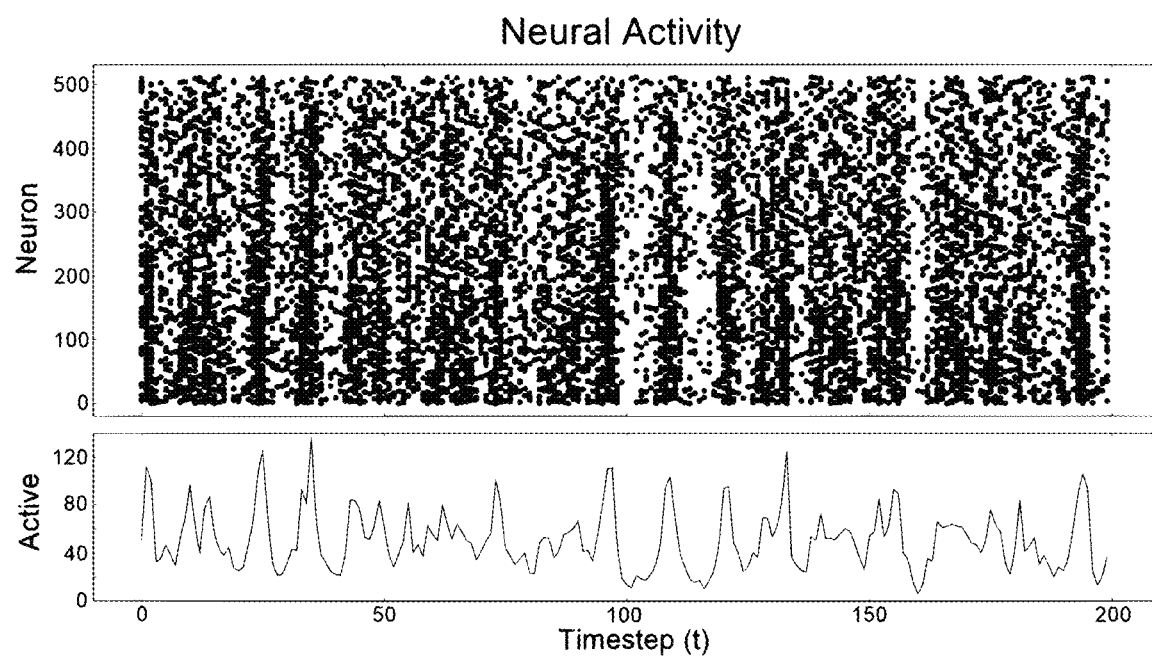
FIG. 8 is a graph showing an example of neural activity of a memristive neural network according to various embodiments of the present disclosure.

FIG. 8 shows a graph representing neural activity of a memristive neural network 200. This graph demonstrates an example of spike-timing dependent plasticity (a biologically plausible plasticity rule ubiquitous in the brain) using memristive synapses. The networks disclosed herein may be used to realize neuromorphic hardware with connectivity and plasticity rules modeled after biological neural networks.

Figure 9:
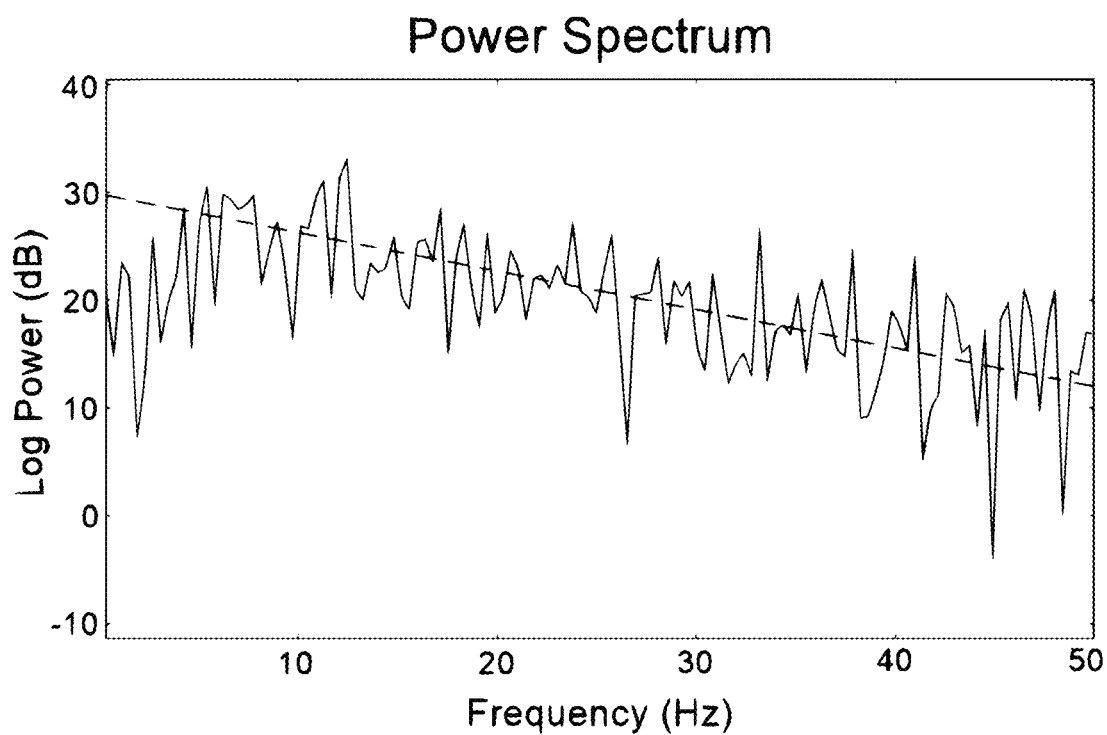
FIG. 9 a graph showing an example of a power spectrum of a memristive neural network according to various embodiments of the present disclosure.

FIG. 9 is a graph that shows a power spectrum of a memristive neural network 200. The log of the power decreases approximately linearly with the frequency after around 10 Hz. This f a structure in the power spectral density can be indicative of long-range temporal correlations between neurons in the network, which suggests a high dynamical memory. This dynamical memory can be exploited in, for example, liquid state machines and other reservoir computing architectures. This disclosure describes an architecture for connecting silicon neurons in neuromorphic hardware using memristive nanofibers. Simulations can show that an array of integrate and fire neurons connected by such a network can have interesting computational properties and can be well suited for reservoir computing architectures.

Disjunctive language used herein, such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language does not imply that certain embodiments require at least one of X, at least one of Y, or at least one of Z to each be present.

The above-described embodiments of the present disclosure are merely examples of implementations set forth for a clear understanding of the principles of the disclosure. Many variations and modifications may be made to the above-described embodiments without departing substantially from the spirit and principles of the disclosure. All such modifications and variations are intended to be included herein within the scope of this disclosure.

The invention claimed is:

1. A memristive device, comprising:
 a first node;
 a second node; and
 a memristive fiber including a conductive core and a memristive shell surrounding at least a portion of the conductive core along at least a portion of the memristive fiber, the memristive fiber coupling the first node to the second node through a portion of the memristive shell and at least a portion of the conductive core.

2. The memristive device of claim 1, wherein the first node and the second node are part of a plurality of nodes.

3. The memristive device of claim 2, wherein the memristive fiber is part of a plurality of memristive fibers and wherein the plurality of memristive fibers sparsely couple the plurality of nodes.

4. The memristive device of claim 1, wherein the memristive shell surrounds the conductive core along the at least the portion memristive fiber.

5. The memristive device of claim 1, wherein the first node includes a first electrode connected to the memristive fiber; and
 the second node includes a second electrode connected to the memristive fiber.

6. The memristive device of claim 5, wherein the first node includes a first neuron connected to the first electrode and the second node includes a second electrode connected to the memristive fiber.

7. The memristive device of claim 1, wherein the memristive shell consists of at least one memristive material.

8. A memristive device, comprising:
 a substrate;
 a plurality of memristive fibers dispersed on the substrate, each of the plurality of memristive fibers including a conductive core and a shell surrounding at least a portion of the conductive core along at least a portion of a length of the conductive core, the shell including at least one memristive material; and
 a plurality of nodes, the plurality of nodes being coupled through a portion of the at least one memristive material and at least part of the conductive core for each of the plurality of memristive fibers.

9. The memristive device of claim 8, wherein the plurality of nodes are sparsely connected through the plurality of memristive fibers.

10. The memristive device of claim 8, wherein the plurality of nodes include:
 a plurality of neurons; and
 a plurality of electrodes electrically coupled with the plurality of neurons, the plurality of electrodes including a plurality of input electrodes and a plurality of output electrodes for the plurality of neurons.

11. The memristive device of claim 8, wherein the shell consists of the at least one memristive material.

12. The memristive device of claim 8, further comprising:
 a second plurality of memristive fibers dispersed on the plurality of memristive fibers, each of the second plurality of memristive fibers including an additional conductive core and an additional shell surrounding at least a portion of the additional conductive core along at least a portion of an additional length of the additional conductive core, the shell including at least one additional memristive material; and a plurality of electrodes, the plurality of electrodes being coupled through a portion of the at least one additional memristive material and at least part of the additional conductive core for each of the second plurality of memristive fibers.

13. The memristive device of claim 12, wherein the additional shell consists of the at least one memristive material.

14. A memristive device, comprising:

a substrate;

a plurality of memristive fibers dispersed on the substrate, each of the plurality of memristive fibers including a conductive core and a memristive shell surrounding at least a portion of the conductive core along at least a portion of a length of the conductive core; and a plurality of electrodes, a plurality of communication paths between the plurality of electrodes including a portion of the memristive shell and at least part of the conductive core for each of at least a portion of the plurality of memristive fibers.

15. The memristive device of claim 14, wherein the plurality of electrodes are sparsely connected through the plurality of memristive fibers.

16. The memristive device of claim 14, further comprising:

a plurality of neurons coupled with the plurality of electrodes, the plurality of electrodes including a plurality of input electrodes and a plurality of output electrodes for the plurality of neurons.

17. The memristive device of claim 14, wherein the memristive shell consists of at least one memristive material.

18. The memristive device of claim 14, further comprising:

a second plurality of memristive fibers dispersed on the plurality of memristive fibers, each of the second plurality of memristive fibers including an additional conductive core and an additional memristive shell surrounding at least a portion of the additional conductive core along at least a portion of an additional length of the additional conductive core, the additional memristive shell including at least one memristive material; and a second plurality of electrodes, the second plurality of electrodes being coupled through a portion of the at least one memristive material and at least part of the additional conductive core for each second of the plurality of memristive fibers.

19. The memristive device of claim 18, wherein the additional memristive shell consists of the at least one memristive material.

* * * * *